United States Patent
Ohoka et al.

(10) Patent No.: US 10,672,878 B2
(45) Date of Patent: Jun. 2, 2020

(54) SILICON CARBIDE SEMICONDUCTOR DEVICE

(71) Applicant: Panasonic Intellectual Property Management Co., Ltd., Osaka (JP)

(72) Inventors: Atsushi Ohoka, Kyoto (JP); Nobuyuki Horikawa, Kyoto (JP); Masao Uchida, Osaka (JP)

(73) Assignee: Panasonic Intellectual Property Management Co., Ltd., Osaka (JP)

( * ) Notice: Subject to any disclaimer, the term of this patent is extended or adjusted under 35 U.S.C. 154(b) by 0 days.

(21) Appl. No.: 16/255,875

(22) Filed: Jan. 24, 2019

(65) Prior Publication Data

US 2019/0245052 A1    Aug. 8, 2019

(30) Foreign Application Priority Data

Feb. 8, 2018   (JP) ................ 2018-021067

(51) Int. Cl.
| | |
|---|---|
| *H01L 29/423* | (2006.01) |
| *H01L 29/06* | (2006.01) |
| *H01L 29/10* | (2006.01) |
| *H01L 23/528* | (2006.01) |
| *H01L 29/417* | (2006.01) |
| *H01L 29/66* | (2006.01) |
| *H01L 29/739* | (2006.01) |

(Continued)

(52) U.S. Cl.
CPC ........ *H01L 29/4238* (2013.01); *H01L 23/528* (2013.01); *H01L 29/0696* (2013.01); *H01L 29/1095* (2013.01); *H01L 29/417* (2013.01); *H01L 29/66068* (2013.01); *H01L 29/1608* (2013.01); *H01L 29/7395* (2013.01); *H01L 29/7802* (2013.01)

(58) Field of Classification Search
CPC ............... H01L 29/4238; H01L 23/528; H01L 29/0696; H01L 29/1095; H01L 29/417; H01L 29/66068; H01L 29/1608; H01L 29/7395; H01L 29/7802; H01L 29/66325–66348; H01L 21/0445–0495; H01L 29/161–167; H01L 29/66053–66068; H01L 21/18–326; H01L 29/083

See application file for complete search history.

(56) References Cited

U.S. PATENT DOCUMENTS

| | | | |
|---|---|---|---|
| 2005/0001217 A1* | 1/2005 | Kusumoto | H01L 21/046 257/77 |
| 2010/0075474 A1* | 3/2010 | Kudou | H01L 29/66068 438/197 |

(Continued)

FOREIGN PATENT DOCUMENTS

| | | |
|---|---|---|
| JP | 2015-076414 | 4/2015 |
| WO | 2012/001837 | 1/2012 |

*Primary Examiner* — Shahed Ahmed
(74) *Attorney, Agent, or Firm* — McDermott Will & Emery LLP

(57) ABSTRACT

The silicon carbide semiconductor device includes a plurality of unit cells each having an MISFET structure and provided on a silicon carbide semiconductor substrate. A gate upper electrode disposed adjacent to the plurality of unit cells includes a gate pad and gate global wires. When viewed in plan, gate electrodes do not overlap with the gate pad.

7 Claims, 4 Drawing Sheets

(51) Int. Cl.
*H01L 29/78* (2006.01)
*H01L 29/16* (2006.01)

(56) References Cited

U.S. PATENT DOCUMENTS

| | | | |
|---|---|---|---|
| 2010/0207125 A1* | 8/2010 | Uchida | H01L 21/0485 257/77 |
| 2012/0326207 A1* | 12/2012 | Yoshimochi | H01L 29/866 257/139 |
| 2013/0168700 A1* | 7/2013 | Furukawa | H01L 29/7805 257/77 |
| 2015/0349051 A1* | 12/2015 | Uchida | H01L 29/7811 257/77 |
| 2016/0300943 A1 | 10/2016 | Hiyoshi et al. | |
| 2017/0098647 A1* | 4/2017 | Uchida | H01L 27/0629 |
| 2017/0110545 A1* | 4/2017 | Nagao | H01L 29/1608 |

* cited by examiner

SILICON CARBIDE SEMICONDUCTOR DEVICE

BACKGROUND

1. Technical Field

The present disclosure relates to a silicon carbide semiconductor device.

2. Description of the Related Art

A power semiconductor device is a semiconductor element for use in applications that require high breakdown voltage and a large amount of current. Such a power semiconductor device is desired to have small power loss. Heretofore, a power semiconductor device including a silicon (Si) substrate has been widely used. In recent years, attention has been given to a power semiconductor device including a silicon carbide (SiC) substrate, and such a power semiconductor device has been developed.

Silicon carbide (SiC) is higher in breakdown electric field by one order of magnitude compared to silicon (Si), and therefore silicon carbide is able to withstand a large breakdown voltage even when a depletion layer is smaller in thickness at a pn-junction or a Schottky junction. The use of silicon carbide enables reduction of thickness of the drift layer and an increase in its doping concentration. Therefore, silicon carbide is expected as a material for realizing a power semiconductor device that exhibits low ON resistance, high breakdown voltage, and low power loss.

In recent years, vehicles driven by a motor, such as hybrid vehicles, electric vehicles, and fuel cell vehicles, have been developed. Since the above-described characteristics of silicon carbide are advantageous as a switching element of an inverter circuit that drives a motor for these vehicles, silicon carbide power semiconductor devices for vehicles have been under development.

A typical semiconductor device employing SiC is a metal-insulator-semiconductor field-effect transistor (MISFET). A metal-oxide-semiconductor field-effect transistor (MOSFET) is a variation of the MISFET. An ordinary MISFET using SiC has an active region arranged with, in a two dimensional manner, a plurality of unit cells each having a transistor structure. The unit cells are electrically connected in parallel to each other.

It has been known that, when a silicon carbide power semiconductor device is used as a switching element, PN-junction capacitance may induce a displacement current, leading to breakdown of the gate insulating film of a field-effect transistor. PTLs 1 and 2 disclose structures capable of suppressing such dielectric breakdown described above.

CITATION LIST

Patent Literature

PTL 1: WO 2012/001837
PTL 2: Unexamined Japanese Patent Publication No. 2015-76414

SUMMARY

In the silicon carbide semiconductor device according to the conventional technique described above, dielectric breakdown may not be fully suppressed from occurring. An aspect of the present disclosure provides a highly reliable silicon carbide semiconductor device that fully suppresses the dielectric breakdown of the gate insulating film.

A silicon carbide semiconductor device according to the present disclosure includes a silicon carbide semiconductor substrate, first body regions, source regions, a second body region, a gate insulating film, gate electrodes, an interlayer insulating film, source contacts, source pads, gate contacts, a gate pad, and gate global wires. The silicon carbide semiconductor substrate is of the first conductivity type and includes a first conductivity type drift layer. A plurality of the first body regions are of the second conductivity type and are formed in a discrete manner on a surface of the drift layer. A plurality of the source regions are of the first conductivity type and are respectively positioned in the plurality of first body regions. The second body region is of the second conductivity type is formed on the surface of the drift layer, and includes first portions and a second portion. A plurality of the first portions are positioned adjacent to the plurality of first body regions when viewed from the surface and include band-shaped portions. The second portion is connected to the plurality of first portions. The gate insulating film is positioned above the plurality of first body regions, the source regions, and the second body region. The gate electrodes are formed, on the gate insulating film, above the plurality of first body regions, parts of the plurality of source regions, and the first portions of the second body region. The interlayer dielectric film is positioned on the gate electrodes, the gate insulating film exposed from the gate electrodes, and the second portion of the second body region. A plurality of the source contacts are provided to the gate insulating film and the interlayer dielectric film and are respectively positioned in the source regions. The source pads are electrically connected to the source regions via the plurality of source contacts and are positioned on parts of the interlayer dielectric film. The gate contacts are provided to the interlayer dielectric film, above the plurality of first portions of the second body region, and allow parts of the gate electrodes to be exposed. The gate pad is positioned on the interlayer dielectric film above the second portion of the second body region. The gate global wires are electrically connected, above the plurality of first portions of the second body region, to the gate electrodes via the gate contacts, and connect to the gate pad. When viewed from the surface of the drift layer, the gate electrodes do not overlap with the gate pad.

According to the aspect of the present disclosure, a highly safe silicon carbide semiconductor device that fully suppresses dielectric breakdown of the gate insulating film during high-speed switching operations can be achieved.

DETAILED DESCRIPTION

Figure 1A:
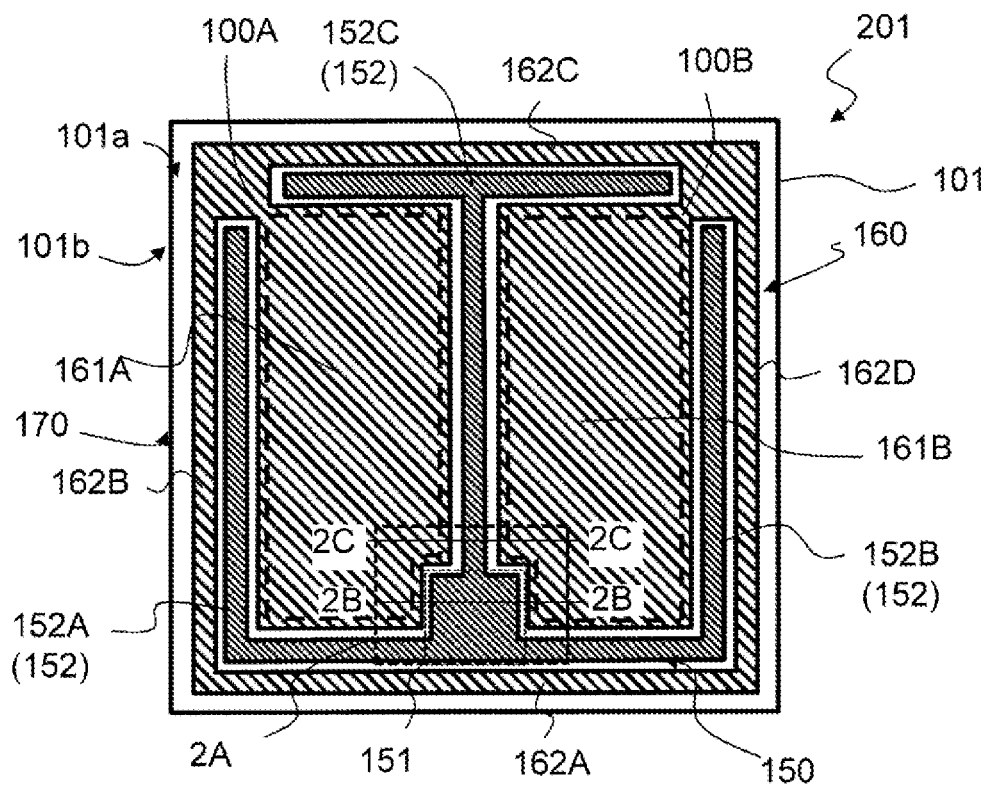
FIG. 1A is a plan view illustrating a silicon carbide semiconductor device according to an exemplary embodiment.

The outline of the silicon carbide semiconductor device of the present disclosure is as follows.

A silicon carbide semiconductor device according to the present disclosure includes a silicon carbide semiconductor substrate, first body regions, source regions, a second body region, a gate insulating film, gate electrodes, an interlayer insulating film, source contacts, source pads, gate contacts, a gate pad, and gate global wires. The silicon carbide semiconductor substrate is of the first conductivity type and includes a first conductivity type drift layer. A plurality of the first body regions are of the second conductivity type and are formed in a discrete manner on a surface of the drift layer. A plurality of the source regions are of the first conductivity type and are respectively positioned in the plurality of first body regions. The second body region is of the second conductivity type is formed on the surface of the drift layer, and includes first portions and a second portion. A plurality of the first portions are positioned adjacent to the plurality of first body regions when viewed from the surface and include band-shaped portions. The second portion is connected to the plurality of first portions. The gate insulating film is positioned above the plurality of first body regions, the source regions, and the second body region. The gate electrodes are formed, on the gate insulating film, above the plurality of first body regions, parts of the plurality of source regions, and the first portions of the second body region. The interlayer dielectric film is positioned on the gate electrodes, the gate insulating film exposed from the gate electrodes, and the second portion of the second body region. A plurality of the source contacts are provided to the gate insulating film and the interlayer dielectric film and are respectively positioned in the source regions. The source pads are electrically connected to the source regions via the plurality of source contacts and are positioned on parts of the interlayer dielectric film. The gate contacts are provided to the interlayer dielectric film, above the plurality of first portions of the second body region, and allow parts of the gate electrodes to be exposed. The gate pad is positioned on the interlayer dielectric film above the second portion of the second body region. The gate global wires are electrically connected, above the plurality of first portions of the second body region, to the gate electrodes via the gate contacts, and connect to the gate pad. When viewed from the surface of the drift layer, the gate electrodes do not overlap with the gate pad.

First body contacts may further be included to the interlayer dielectric film and the gate insulating film, extending along parts of an outer edge of the gate pad when viewed from the surface of the drift layer and positioned in the second portion of the second body region. The source pads may be electrically connected to the second portion of the second body region via the first body contacts.

The first body contacts may further include portions extending along the gate global wires to allow the first portions of the second body region to be exposed.

When viewed from the surface of the drift layer, the first body contacts may be positioned between the gate electrodes and the gate pad.

Second body contacts may further be included to the gate insulating film and the interlayer dielectric film and positioned between the plurality of source contacts and the gate contacts in the first portions of the second body region. The source pads may be electrically connected to the first portions of the second body region via the second body contacts.

The silicon carbide semiconductor device may further include first contact regions, source electrodes, second contact regions, third contact regions, first base electrodes, and second base electrodes. The first contact regions are of the second conductivity type, formed between the source regions within the plurality of first body regions, and reach the first body regions. The source electrodes are electrically connected to the first contact regions and the source regions. The second contact regions are of the second conductivity type, and are formed in the second body region. The third contact regions are of the second conductivity type, and are formed in the second body region. The first base electrodes are electrically connected to the second contact regions. The second base electrodes are electrically connected to the first base electrodes and the third contact regions. The source contacts allow the source electrodes to be exposed, whereas the first body contacts allow the first base electrodes to be exposed. The second body contacts allow the second base electrodes to be exposed.

The second contact regions may be positioned in at least parts of the second body region having three sides surrounded by the first base electrodes. The third contact regions are positioned in at least parts of the second body region sandwiched by the second base electrodes that are discrete.

A silicon carbide semiconductor device according to an exemplary embodiment of the present disclosure will now be described herein with reference to the accompanying drawings.

FIG. 1A is a plan view of silicon carbide semiconductor device 201 according to the exemplary embodiment. In the exemplary embodiment, silicon carbide semiconductor device 201 is a MISFET. Silicon carbide semiconductor device 201 includes silicon carbide semiconductor substrate 101, as well as gate upper electrode 150 and source upper electrode 160 provided on the first main surface 101a of silicon carbide semiconductor substrate 101.

Silicon carbide semiconductor substrate 101 includes, on the first main surface 101a, an active region or a plurality of active regions. In the exemplary embodiment, silicon carbide semiconductor substrate 101 includes active regions 100A and 100B. Silicon carbide semiconductor device 201 has a structure in which a plurality of vertical-type transistors are electrically connected in parallel to each other. Active regions 100A and 100B are regions in which a plurality of unit cells configuring the transistors are disposed. In the exemplary embodiment, active regions 100A and 100B respectively have rectangular shapes respectively having cut-away portions at one of the apexes, and are disposed on the first main surface 101a such that the cut-away portions are positioned adjacent to each other.

Gate upper electrode 150 includes a gate pad 151 and a plurality of gate global wires 152. In the exemplary embodiment, gate upper electrode 150 includes gate global wires 152A, 152B, and 152C. Gate pad 151 serves as a region for bonding wires used to externally apply a gate voltage, and has a dimension according to a specification, for example.

Gate global wires 152A, 152B, and 152C are respectively connected to gate pad 151. In the exemplary embodiment, gate global wires 152A and 152B respectively have L shapes, whereas gate global wire 152C has a T shape. On the first main surface 101a, gate pad 151 is disposed on the cut-away portions of active regions 100A and 100B. Gate global wires 152A and 152B are respectively connected to the gate pad, and are disposed adjacent to respective two sides of active regions 100A and 100B. Gate global wire 152C is disposed such that a center stripe of the T shape is sandwiched between active regions 100A and 100B.

Source upper electrode 160 includes source pads and outer periphery source wires. In the exemplary embodiment, source pads 161A and 161B and outer periphery source wires 162A to 162D are included. Source pads 161A and 161B are respectively disposed on active regions 100A and 100B, whereas outer periphery source wires 162A to 162D are disposed outside of gate upper electrode 150, therefore surrounding the gate upper electrode 150.

As will be described later, drain pad 170 is provided on the second main surface 101b of silicon carbide semiconductor substrate 101. By applying a gate voltage exceeding a threshold value to gate pad 151, silicon carbide semiconductor device 201 is turned on, allowing current flow between source pads 161A and 161B and drain pad 170.

Figure 1B:
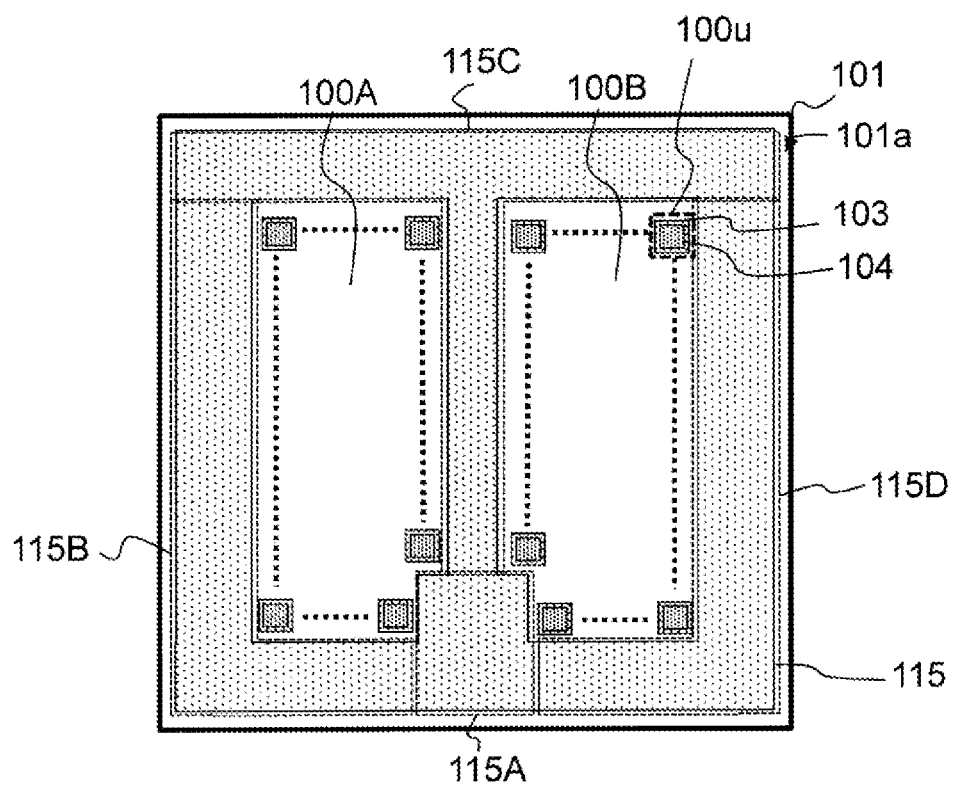
FIG. 1B is a plan view illustrating regions on a surface of a silicon carbide semiconductor substrate of the silicon carbide semiconductor device.
Figure 2A:
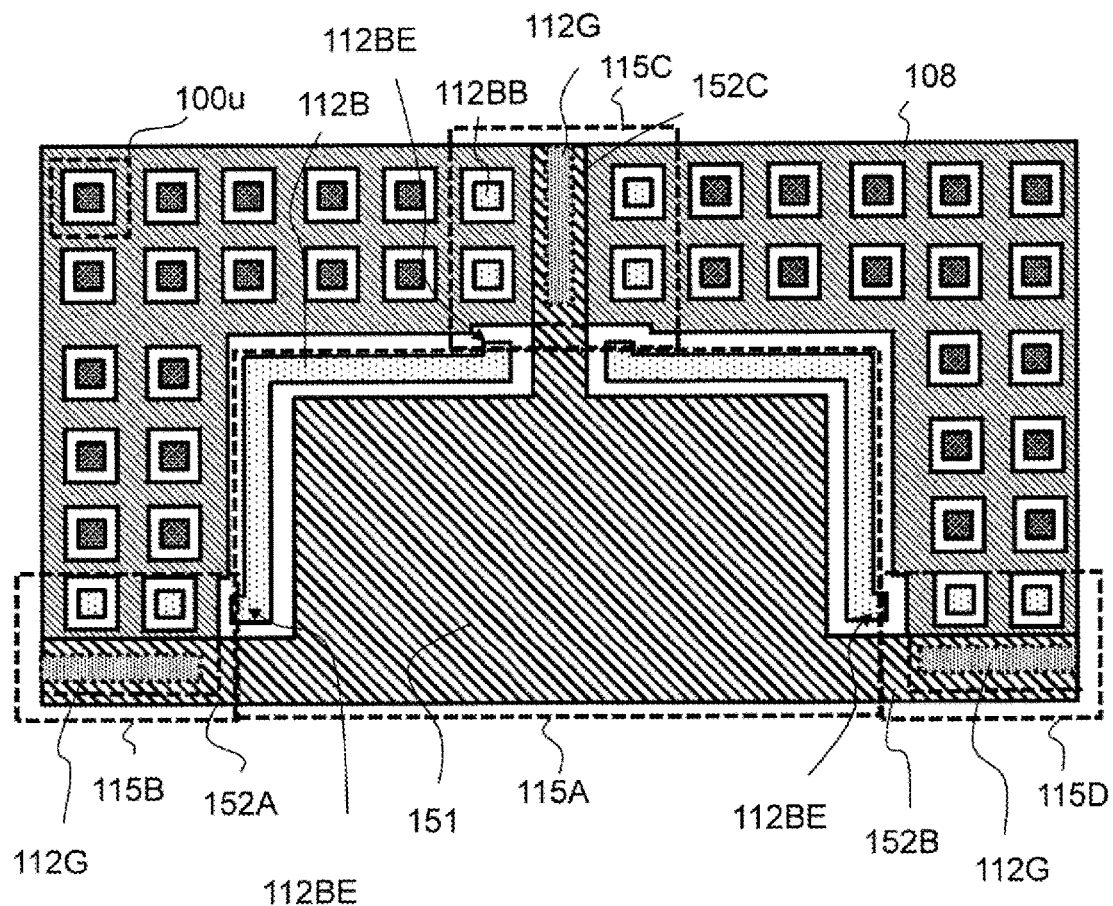
FIG. 2A is an enlarged plan view of region 2A in FIG. 1A, and is a view illustrating a structure when source pads are removed.
Figure 2B:
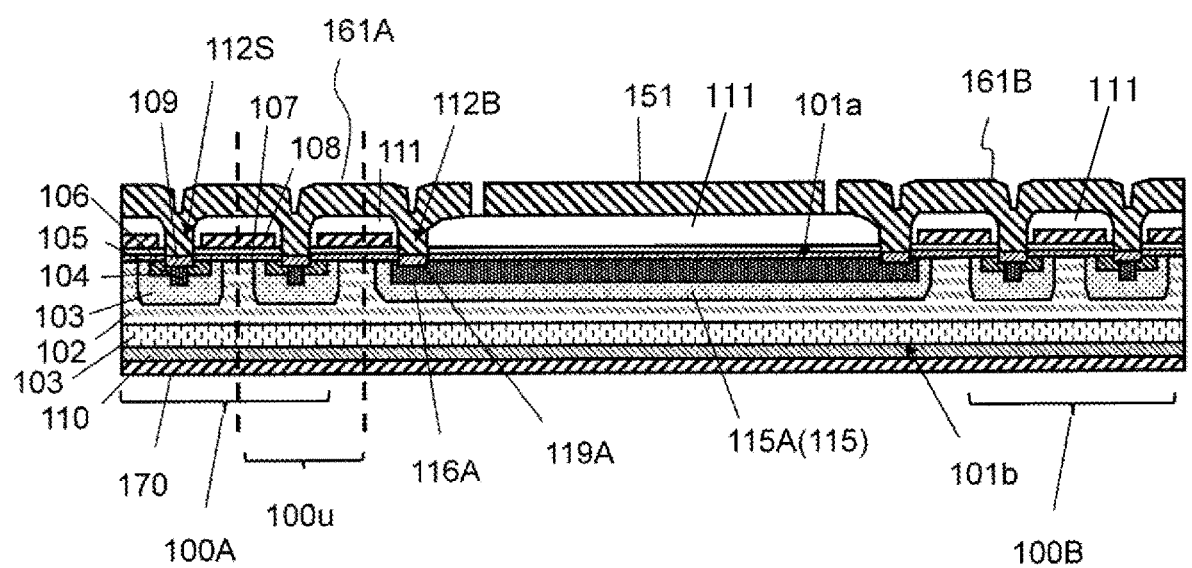
FIG. 2B is a sectional view of the silicon carbide semiconductor device taken along line 2B-2B in FIG. 1A.
Figure 2C:
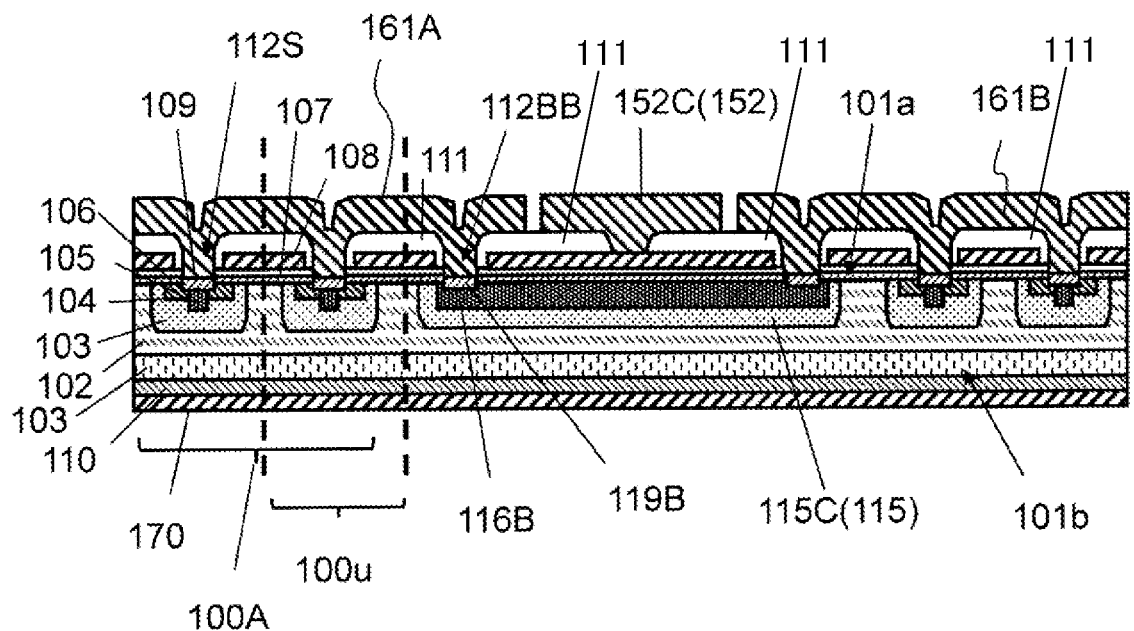
FIG. 2C is a sectional view of the silicon carbide semiconductor device taken along line 2C-2C in FIG. 1A.

FIG. 2A is an enlarged plan view of silicon carbide semiconductor device 201 in region 2A illustrated in FIG. 1A, and illustrates a structure when source upper electrode 160 is removed. FIGS. 2B and 2C respectively illustrate a section taken along line 2B-2B in FIG. 1A and a section taken along line 2C-2C in FIG. 1A. FIG. 1B is a plan view of first main surface 101a representing a surface of a drift layer of silicon carbide semiconductor substrate 101. As described above, a plurality of first body regions 103 are positioned in a discrete manner in active regions 100A and 100B. First body regions 103 are respectively provided with source regions 104.

Silicon carbide semiconductor device 201 includes, in active regions 100A and 100B, a plurality of unit cells 100u. The configuration of each of unit cells 100u will first be described.

The plurality of unit cells 100u respectively function as MOSFETs, and are connected in parallel to each other. In other words, unit cells 100u constitute transistors, and thus silicon carbide semiconductor device 201 includes a plurality of the transistors. When viewed in a direction perpendicular to the first main surface 101a of silicon carbide semiconductor substrate 101, the plurality of unit cells 100u are respectively arranged in a two-dimensional manner in active regions 100A and 100B.

Silicon carbide semiconductor substrate 101 is made of mono-crystal silicon carbide semiconductor that is of the first conductivity type, and includes first main surface 101a and second main surface 101b that are positioned opposite to each other. Silicon carbide semiconductor substrate 101 includes, adjacent to the first main surface 101a, drift layer 102 that also of the first conductivity type. On silicon carbide semiconductor substrate 101, drift layer 102 is formed through epitaxial growth on a silicon carbide wafer, for example. In the exemplary embodiment, the first conductivity type represents n-type, whereas the second conductivity type represents p-type. However, the first conductivity type may be the p-type, whereas the second conductivity type may be the n-type.

Unit cells 100u each include silicon carbide semiconductor substrate 101 including drift layer 102, first body regions 103 that are of the second conductivity type and are selectively formed on the surface of drift layer 102, source regions 104 that are selectively formed on surfaces in first body regions 103, gate insulating film 107 positioned above the first body regions and source regions 104, gate electrodes 108 positioned on gate insulating film 107, and drain electrode 110. Silicon carbide semiconductor layer 106 may be provided, with a channel layer, between drift layer 102 and gate insulating film 107.

On drift layer 102, source regions 104 contain impurities of the first conductivity type at a high concentration ($n^+$-type). For electrical connection to the first body regions 103, first contact regions 105 that are of the second conductivity type and include impurities of the second conductivity type at a concentration higher than the concentration of the impurities in first body regions 103 are provided. The surface of drift layer 102 is provided with source electrodes 109 electrically connected, through ohmic contact, to source regions 104 and first contact regions 105. Therefore, first body regions 103 are electrically coupled to source electrodes 109 via first contact regions 105.

First body regions 103, source regions 104, and first contact regions 105 are formed through, for example, a step of implanting impurities into the drift layer 102, and a high-temperature thermal treatment (activation anneal) step of activating the impurities implanted into the drift layer 102. Source electrodes 109 are formed, for example, by depositing a conductive material (Ni) layer, for example, on source regions 104 and first contact regions 105 in drift layer 102, and then performing thermal treatment at a high temperature.

Source regions 104 and drift layer 102 are connected via silicon carbide semiconductor layer 106 serving as a channel layer. Silicon carbide semiconductor layer 106 is a 4H-SiC layer formed on the drift layer 102 through epitaxial growth, for example, and contains impurities of the first conductivity type. A thickness of silicon carbide semiconductor layer 106 may be 75 nm or thinner, for example. The impurity concentration may be $1 \times 10^{18}$ cm$^{-3}$ or higher.

Source regions 104 and first contact regions 105 respectively form ohmic contacts together with source electrodes 109. If silicon carbide semiconductor device 201 does not include silicon carbide semiconductor layer 106, transistors can be operated by applying a gate voltage to form an inversion layer to serve as a channel adjacent to the surface of the first body regions 103.

Gate insulating film 107 is, for example, a thermal oxide film ($SiO_2$ film) formed on the surface of silicon carbide semiconductor layer 106 through thermal oxidation. Gate electrodes 108 are made of conductive polysilicon, for example. Gate electrodes 108 of unit cells 100u adjacent to each other are connected to each other.

In active region 100A, interlayer dielectric film 111 is positioned on gate electrodes 108 and gate insulating film 107 exposed from the gate electrodes. Gate insulating film 107 and interlayer dielectric film 111 are respectively provided with a plurality of source contacts 112S allowing parts of source regions 104 and first contact regions 105 to be exposed. More specifically, source contacts 112S allow source electrodes 109 positioned on source regions 104 and first contact regions 105 to be exposed. In the present disclosure, source contacts 112S mean contact holes or openings provided on the gate insulating film 107 and interlayer dielectric film 111. Hereinafter, gate contacts mean contact holes or openings provided on the interlayer dielectric film 111, whereas first well contacts and second well contacts mean contact holes or openings provided on the gate insulating film 107 and interlayer dielectric film 111.

Source pads 161A and 161B described above are positioned on interlayer dielectric film 111 in active regions 100A and 100B. Source pads 161A and 161B are electrically connected to the plurality of source regions 104 and first contact regions 105 via the plurality of source contacts 112S provided to the interlayer dielectric film 111. More specifically, source electrodes 109 and source pads 161A and 161B that are in ohmic contact with source regions 104 are electrically connected via source contacts 112S.

On second main surface 101b of silicon carbide semiconductor substrate 101, drain electrode 110 that is in ohmic contact with the second main surface 101b is positioned, and drain pad 170 covering drain electrode 110 is provided.

Next, a structure of a portion at which gate upper electrode 150 of silicon carbide semiconductor device 201 is positioned will be described. Silicon carbide semiconductor device 201 includes, on the first main surface 101a, second body region 115 positioned adjacent to and surrounding active regions 100A and 100B, i.e., the plurality of first body regions 103. Second body region 115 includes a plurality of first portions 115B, 115C, and 115D that are band-shaped, and second portion 115A connected to first portions 115B, 115C, and 115D. As described above, since, in unit cells 100u, source pads 161A and 161B respectively cover gate electrodes 108 via interlayer dielectric film 111, gate upper electrode 150 cannot be provided in active regions 100A and 100B in which unit cells 100u are positioned. Therefore, gate upper electrode 150 is provided to overlap, when viewed in plan, with second body region 115 adjacent to active regions 100A and 100B.

As illustrated in FIG. 2B, on second portion 115A of second body region 115, gate insulating film 107 is positioned, and, on gate insulating film 107, interlayer dielectric film 111 is further positioned. When silicon carbide semiconductor device 201 includes silicon carbide semiconductor layer 106, silicon carbide semiconductor layer 106 is positioned between second portion 115A of second body region 115 and gate insulating film 107. No gate electrode 108 is positioned on second portion 115A of second body region 115.

On interlayer insulating film 111, gate pad 151 is positioned. As illustrated in FIG. 2A, when viewed in plan-view in a direction perpendicular to the first main surface 101a, gate electrodes 108 do not overlap with gate pad 151. Interlayer dielectric film 111 and gate insulating film 107 are provided with first body contacts 112B. As illustrated in FIG. 2A, when viewed in plan, first body contacts 112B are positioned between gate pad 151 and gate electrodes 108. First body contacts 112B respectively have a band shape extending along parts of an outer edge of the gate pad 151. Preferably, first body contacts 112B include portions 112BE respectively extending along gate global wires 152A, 152B, and 152C.

In active regions 100A and 100B, source pads 161A and 161B provided on interlayer dielectric film 111 extend to a peripheral edge of second portion 115A of second body region 115, and are electrically connected to second portion 115A of second body region 115 via first body contacts 112B. More specifically, silicon carbide semiconductor device 201 includes second conductivity type second contact regions 116A and first base electrodes 119A that are formed in second portion 115A of second body region 115. First base electrodes 119A are in ohmic contact with second contact regions 116A. Second contact regions 116A may be at least positioned under first body contacts 112B, and, more preferably, positioned in the region whose three sides surrounded by first base electrodes 119A in second portion 115A of second body region 115. Therefore, resistance in second portion 115A of second body region 115 can be reduced. First body contacts 112B allow first base electrodes 119A to be exposed. When source pads 161A and 161B come into contact with first base electrodes 119A via first body contacts 112B, source pads 161A and 161B are electrically connected to second body region 115.

As illustrated in FIG. 2C, on first portion 115C of second body region 115, gate insulating film 107 is positioned, and, on the gate insulating film, gate electrodes 108 are positioned. Further, on gate electrodes 108, interlayer dielectric film 111 is positioned. When silicon carbide semiconductor device 201 includes silicon carbide semiconductor layer 106, silicon carbide semiconductor layer 106 is positioned between first portion 115C of second body region 115 and gate insulating film 107.

On interlayer dielectric film 111, gate global wire 152C is positioned. Interlayer dielectric film 111 is provided with gate contacts 112G. As illustrated in FIG. 2A, one of gate contacts 112G extends along gate global wire 152C. In the exemplary embodiment, gate global wire 152C is electrically connected to gate electrodes 108 via gate contacts 112G.

In active regions 100A and 100B, source pads 161A and 161B provided on interlayer dielectric film 111 extend to a peripheral edge of first portion 115C of second body region 115, and are electrically connected to first portion 115C of second body region 115 via second body contacts 112BB. More specifically, silicon carbide semiconductor device 201 includes second conductivity type third contact regions 116B and second base electrodes 119B that are formed in first portion 115C of second body region 115. Second base electrodes 119B are in ohmic contact with the third contact regions 116B. Third contact regions 116B may be at least positioned under second body contacts 112BB, and, more preferably, positioned in the region between second base electrodes 119B that are discretely formed in first portion 115C of second body region 115. Therefore, resistance in first portion 115C of second body region 115 can be reduced. Second body contacts 112BB allow second base electrodes 119B to be exposed. When source pads 161A and 161B come into contact with second base electrodes 119B via second body contacts 112BB, source pads 161A and 161B are electrically connected to first portion 115C of second body region 115.

When viewed in plan-view in a direction perpendicular to the first main surface 101a, second body contacts 112BB are positioned between the plurality of source contacts 112S and gate contacts 112G in first portion 115C of the second body region 115.

Silicon carbide semiconductor device 201 includes, further on first portions 115B and 115D of second body region 115, a structure similar to the structure of first portion 115C.

Silicon carbide semiconductor device 201 can be produced with a procedure similar to a procedure of producing an ordinary semiconductor device by using elemental technologies in producing semiconductor devices described in conformity to the description of the components. Structures other than the structure of unit cells 100u can be produced with steps identical to steps of producing the components included in unit cells 100u, for example. Specifically, second body region 115 can be produced in a step identical to a step of producing first body regions 103. Second contact regions 116A and third contact regions 116B can also be produced in a step identical to a step of producing first contact regions 105. First base electrodes 119A and second base electrodes 119B can be produced simultaneously with source electrodes 109.

Next, operations of silicon carbide semiconductor device 201 will be described. When switching takes place at a high speed in silicon carbide semiconductor device 201, PN-junction capacitance may induce a displacement current to flow. Since a PN-junction is formed at the interface between drift layer 102 and first body regions 103 as well as second body region 115, the displacement current flows into first body regions 103 and second body region 115. Depending on the magnitude of the displacement current, as well as impurity concentration and depth of a region into which the displacement current flows, potential is generated in first body regions 103 and second body region 115. More specifically, the potential generated in each of body regions is determined by $V=C\times(dV/dt)\times R$.

When a displacement current flows into first body regions 103, C is specified by PN-junction capacitance formed by drift layer 102 and first body regions 103, whereas R is specified by the sum of resistance of first body regions 103 and contact resistance of portions of source electrodes 109, which abut first contact regions 105. On the other hand, when a displacement current flows into second body region 115, C is specified by PN-junction capacitance formed by drift layer 102 and second body region 115, whereas R is specified by the sum of resistance of second body region 115 and contact resistance of first base electrodes 119A. (dV/dt) is specified by the switching speed, in other words, an amount of change in drain-to-source voltage per unit time. First body regions 103 are independent for each unit cell 100u. Area of each of first body regions 103 is small, making PN-junction capacitance C is also small. Therefore, the potential generated by the displacement current becomes relatively small. First body regions 103 are electrically connected to source pad 161A via first contact regions 105. Therefore, the generated displacement current can easily escape to source pad 161A. The impact of a displacement current due to high-speed switching, as described above, is small in first body regions 103.

On the other hand, second portion 115A in second body region 115 is a region in which gate pad 151 is formed, has a larger area, and has a larger PN-junction capacitance C. A displacement current to be generated is thus greater. Therefore, the potential to be generated in second body region 115 is relatively higher.

However, according to silicon carbide semiconductor device 201, gate electrodes 108 and gate insulating film 107, which is positioned underneath gate electrodes 108, are not present above the region of second portion 115A in second body region 115 that overlaps with the gate pad 151 when viewed in plan-view. Therefore, even when relatively high potential is generated in second portion 115A of second body region 115, gate insulating film 107 is not exposed to the relatively high potential difference between second portion 115A of second body region 115 and gate electrodes 108, fundamentally suppressing dielectric breakdown of the gate insulating film 107. Therefore, device failure due to breakdown of the gate insulating film around the gate pad can be suppressed, allowing safety operation during high-speed switching operations.

When viewed in plan-view in a direction perpendicular to the first main surface 101a, first body contacts 112B are provided to interlayer dielectric film 111 and gate insulating film 107 between gate electrodes 108 and gate pad 151 along the parts of the outer edge of gate pad 151. Therefore, the displacement current generated in second portion 115A in second body region 115 can escape to source pads 161A and 161B via first body contacts 112B. By continuously forming first body contacts 112B as a single line, as described above, contact resistance of first base electrodes 119A can be reduced along the displacement current path, reducing the potential difference applied to interlayer dielectric film 111 between gate pad 151 and second portion 115A of second body region 115, and further improving safety during high-speed switching operations.

Since first body contacts 112B extending along gate global wires 152 can further reduce contact resistance in first base electrodes 119A near the boundary of gate pad 151 and gate global wires 152, potential difference applied to interlayer dielectric film 111 between gate pad 151 and second portion 115A of second body region 115 can be further reduced. As first body contacts 112B extend, gate electrodes 108 and gate insulating film 107, which is positioned underneath gate electrodes 108, recede further away from the displacement current path, suppressing breakdown in gate insulating film 107 positioned under gate global wires 152 around gate pad 151.

Further, when viewed in plan-view in a direction perpendicular to the first main surface 101a, since second body contacts 112BB are provided at first portions 115B, 115C, and 115D of second body region 115 between source contacts 112S and gate contacts 112G, displacement current generated under gate global wires 152 can escape to source pads 161A and 161B via second body contacts 112BB. Second body contacts 112BB provided along gate global wires 152 can suppress, to a minimum, a rise in potential generated in first portions 115B, 115C, and 115D of second body region 115, suppressing dielectric breakdown of the gate insulating film 107 under gate global wires 152.

As described above, the silicon carbide semiconductor device according to the present disclosure is achieved based on a new device design concept under which, to suppress breakdown of the gate insulating film, which can occur due to displacement current generated under the gate pad, the gate pad and the gate electrodes are not disposed in an overlapped manner when viewed in plan-view. Therefore, gate insulating film that breaks down due to displacement current generated during high-speed switching in a silicon carbide semiconductor device can be fundamentally eliminated from the silicon carbide semiconductor device, improving safety of the silicon carbide semiconductor device during high-speed switching operations.

Figure 3A:
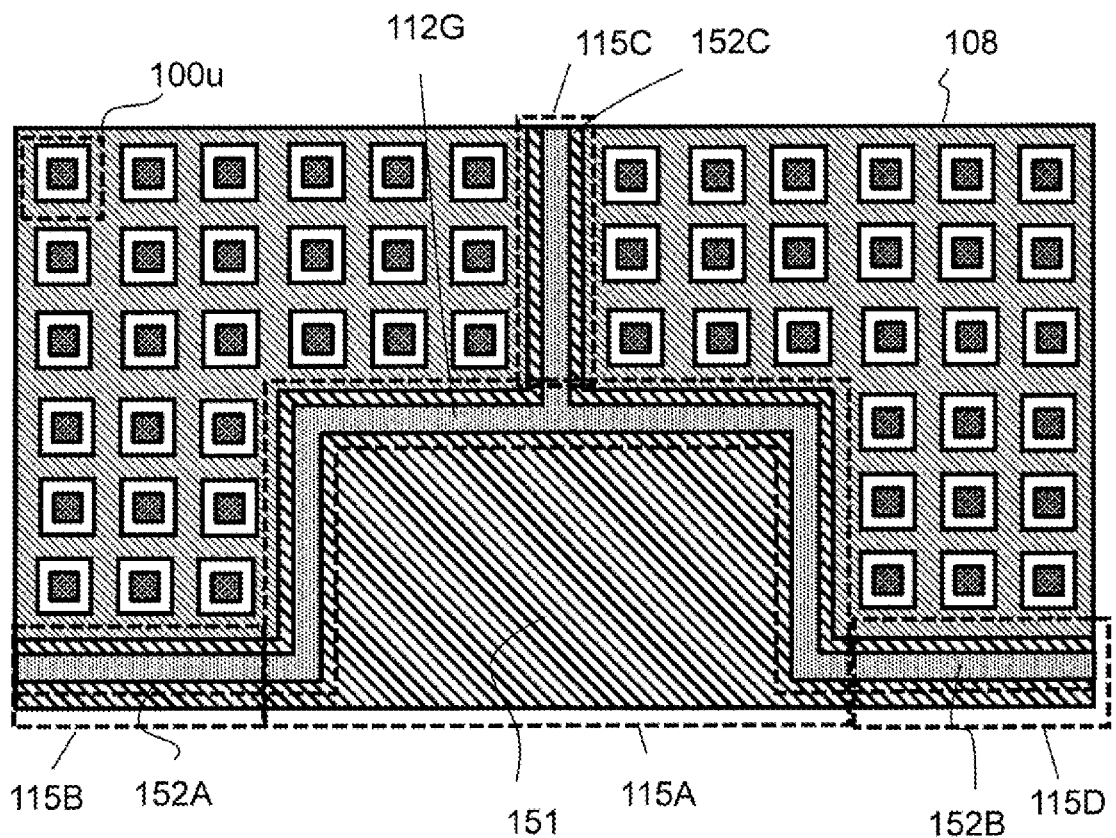
FIG. 3A is an enlarged plan view, corresponding to FIG. 2A, of a silicon carbide semiconductor device based on conventional design concepts.
Figure 3B:
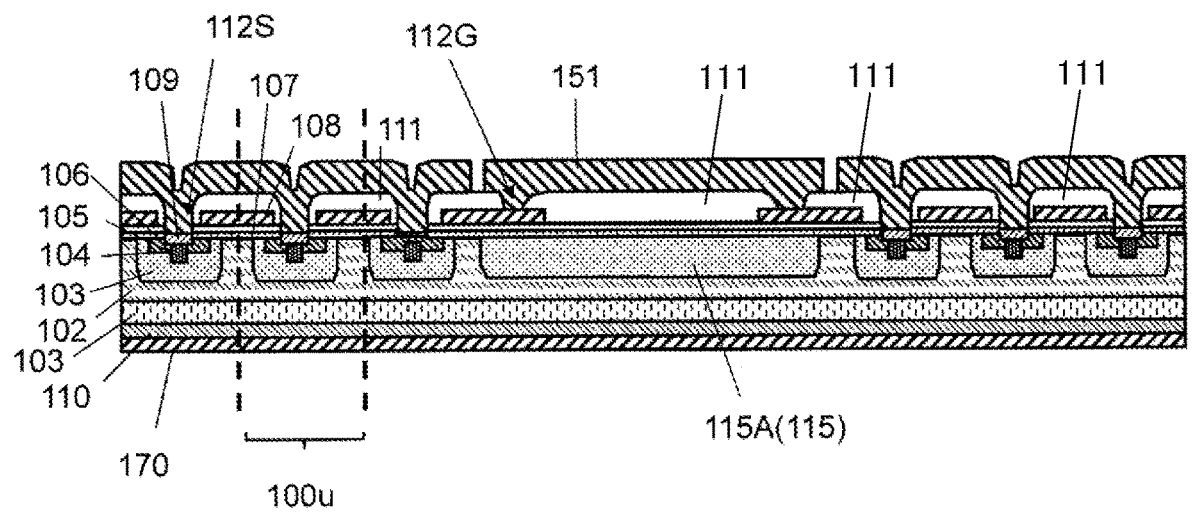
FIG. 3B is a sectional view, corresponding to FIG. 2B, of the silicon carbide semiconductor device based on the conventional design concepts.
Figure 3C:
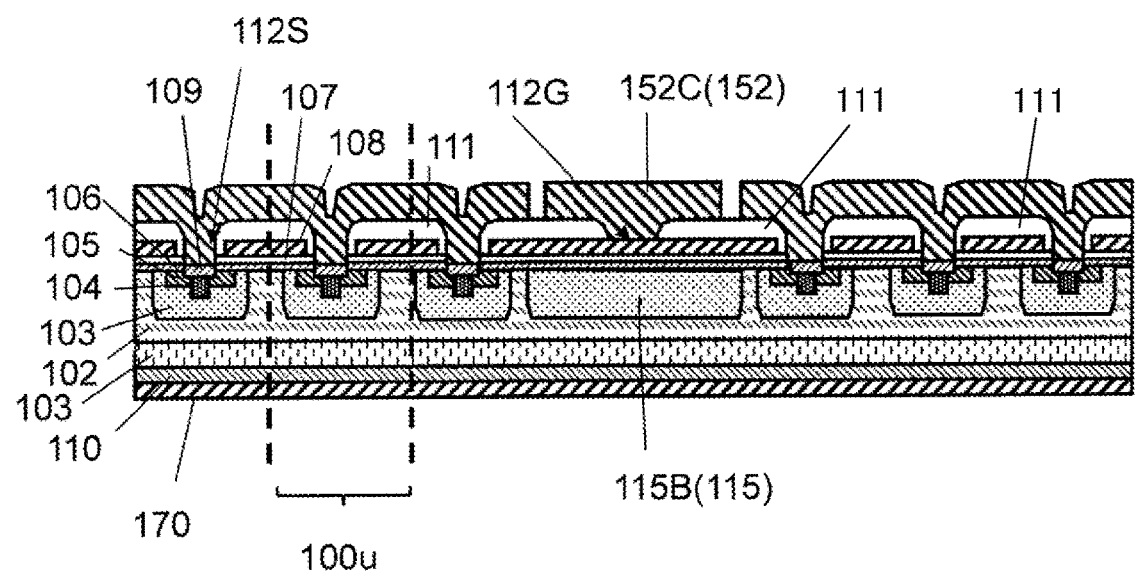
FIG. 3C is a sectional view, corresponding to FIG. 2C, of the silicon carbide semiconductor device based on the conventional design concepts.

According to the conventional design concepts, gate pad and gate electrodes are disposed in an overlapped manner. FIGS. 3A, 3B, and 3C correspond to FIGS. 2A, 2B, and 2C, and illustrate a plan view and sections of the silicon carbide semiconductor device including a structure based on conventional design concepts. As illustrated in FIGS. 3A, 3B, and 3C, gate electrodes 108 are disposed so as to overlap with an area around the outer periphery of gate pad 151 to form gate contact 112G over first portions 115B, 115C, and 115D of second body region 115 and the outer edge portion of second portion 115A. Therefore, in this structure, when potential in second body region 115 rises in any of first portions 115B, 115C, and 115D and second portion 115A of second body region 115, gate insulating film 107 underneath gate electrodes 108 is exposed to relatively high potential difference generated between second body region 115 and gate electrodes 108, likely leading to breakdown of the gate insulating film 107. That is, even when a structure with less likelihood of dielectric breakdown of a gate insulating film, as disclosed in PTLs 1 and 2, is provided, there is a possibility of dielectric breakdown of the gate insulating film as long as gate pad and gate electrodes overlap with each other. Particularly around gate pad 151, where the area is larger and thus a displacement current generated is larger, the design concept of the present disclosure is effective. In terms of this, it can be concluded that the silicon carbide semiconductor device according to the present disclosure suppresses dielectric breakdown in the gate insulating film under a concept different from the conventional concept.

The silicon carbide semiconductor device according to the present disclosure is not limited to the exemplary embodiment described above, but may be variously modified. For example, a number of the active regions is not limited to two, but may be one or three or more. Gate global wires are not limited in number, position, and shape applied in the exemplary embodiment described above. Further, the unit cells may be disposed on the first main surface in a grid or lattice pattern. Silicon carbide semiconductor device may further include an conventional terminal structure surrounding an active region.

A silicon carbide semiconductor device according to the exemplary embodiment is not limited to a planar-structured vertical MISFET, but may be a trench-structured vertical MISFET. Alternatively, a silicon carbide semiconductor device according to the exemplary embodiment may be an insulated gate bipolar transistor (IGBT) using a silicon carbide substrate having a conductivity type that differs from a conductivity type of a silicon carbide semiconductor layer.

The silicon carbide semiconductor device according to the present disclosure is widely applicable to semiconductor devices for various purposes and various drive devices provided with the same, such as inverter circuits. For example, the silicon carbide semiconductor device is well applicable to semiconductor devices to be mounted on vehicles or for industrial devices.

What is claimed is:

1. A silicon carbide semiconductor device comprising:
    a silicon carbide semiconductor substrate being a first conductivity type and including a drift layer being the first conductivity type;
    a plurality of first body regions being a second conductivity type and formed in a discrete manner on a surface of the drift layer;
    a plurality of source regions being the first conductivity type and respectively positioned in the plurality of first body regions;
    a second body region being the second conductivity type, formed on the surface of the drift layer, and including a plurality of first portions and a second portion, the plurality of first portions being positioned adjacent to the plurality of first body regions when viewed from the surface of the drift layer and including band-shaped portions, the second portion being coupled to the plurality of first portions;
    a gate insulating film positioned above the plurality of first body regions, the source regions, and the second body region;
    gate electrodes formed, on the gate insulating film, above the plurality of first body regions, parts of the plurality of source regions, and the first portions of the second body region;
    an interlayer insulating film positioned on the gate electrodes, the gate insulating film exposed from the gate electrodes, and above the second portion of the second body region;
    a plurality of source contacts provided to the gate insulating film and the interlayer insulating film, the plurality of source contacts respectively being coupled to the plurality of source regions;
    source pads electrically coupled to the source regions via the plurality of source contacts, the source pads being positioned on parts of the interlayer insulating film;
    gate contacts provided to the interlayer insulating film in the plurality of first portions of the second body region, the gate contacts allowing parts of the gate electrodes to be exposed;
    a gate pad positioned on the interlayer insulating film above the second portion of the second body region; and
    gate global wires electrically coupled, above the plurality of first portions of the second body region, to the gate electrodes via the gate contacts, and coupled to the gate pad,
    wherein, when viewed from the surface of the drift layer, the gate electrodes do not overlap the gate pad.

2. The silicon carbide semiconductor device according to claim 1, further comprising first body contacts provided to the interlayer insulating film and the gate insulating film, the first body contacts extending, when viewed from the surface of the drift layer, along parts of an outer edge of the gate pad, the first body contacts being positioned in the second portion of the second body region,
    wherein the source pads are electrically coupled to the second portion of the second body region via the first body contacts.

3. The silicon carbide semiconductor device according to claim 2, wherein the first body contacts further include portions extending along the gate global wires to allow the first portions of the second body region to be exposed.

4. The silicon carbide semiconductor device according to claim 2, wherein, when viewed from the surface of the drift layer, the first body contacts are positioned between the gate electrodes and the gate pad.

5. The silicon carbide semiconductor device according to claim 1, further comprising second body contacts provided to the gate insulating film and the interlayer insulating film, the second body contacts being positioned between the plurality of source contacts and the gate contacts in the first portions of the second body region,
    wherein the source pads are electrically coupled to the first portions of the second body region via the second body contacts.

6. The silicon carbide semiconductor device according to claim 1, further comprising:
    first contact regions being the second conductivity type, formed in the source regions of the plurality of first body regions, and reaching the first body regions;
    source electrodes electrically coupled to the first contact regions and the source regions;
    second contact regions being the second conductivity type and formed in the second body region;
    third contact regions being the second conductivity type and formed in the second body region;
    first base electrodes electrically coupled to the second contact regions; and
    second base electrodes electrically coupled to the third contact regions,
    wherein the source contacts allow the source electrodes to be exposed,
    the first body contacts allow the first base electrodes to be exposed, and
    the second body contacts allow the second base electrodes to be exposed.

7. The silicon carbide semiconductor device according to claim 1, wherein
the second contact regions are positioned in at least parts of the second body region having three sides surrounded by the first base electrodes, and
the third contact regions are positioned in at least parts of the second body region pinched by the second base electrodes being discrete.

* * * * *